(12) United States Patent
Shim et al.

(10) Patent No.: US 11,820,669 B2
(45) Date of Patent: Nov. 21, 2023

(54) LAYERED COMPOUND AND NANOSHEET CONTAINING INDIUM AND ARSENIC, AND ELECTRICAL DEVICE USING THE SAME

(71) Applicant: Industry-Academic Cooperation Foundation, Yonsei University, Seoul (KR)

(72) Inventors: Woo-young Shim, Seoul (KR); Tae-young Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 225 days.

(21) Appl. No.: 17/111,003

(22) Filed: Dec. 3, 2020

(65) Prior Publication Data

US 2022/0081314 A1 Mar. 17, 2022

(30) Foreign Application Priority Data

Sep. 14, 2020 (KR) .................. 10-2020-0117533

(51) Int. Cl.
*C01G 15/00* (2006.01)
*H01L 29/06* (2006.01)
*B82Y 30/00* (2011.01)

(52) U.S. Cl.
CPC ........ *C01G 15/006* (2013.01); *H01L 29/0665* (2013.01); *B82Y 30/00* (2013.01); *C01P 2004/24* (2013.01)

(58) Field of Classification Search
CPC ... B82Y 30/00; C01G 15/006; C01P 2004/24; H01L 29/0665
See application file for complete search history.

(56) References Cited

U.S. PATENT DOCUMENTS

2019/0352799 A1  11/2019  Shim et al.

FOREIGN PATENT DOCUMENTS

KR   20190132294 A   11/2019

OTHER PUBLICATIONS

Young et al, "KR20190132294A—Translation", 2019, Google, pp. 1-7 (Year: 2019).*
Kirfel, A. Petcov et al, "Physical, and Chemical Aspects of Crystalline Materials", International Journal, vol. 195, No. 1/2, 1991.
Gerd Norga, "European Search Report for EP Application No. 20211720.6", dated Jun. 7, 2021, EPO, Germany.

* cited by examiner

*Primary Examiner* — Maria V Ewald
*Assistant Examiner* — Ethan Weydemeyer
(74) *Attorney, Agent, or Firm* — Bridgeway IP Law Group, PLLC; Jihun Kim (57) ABSTRACT

Proposed are a layered compound having indium and arsenic, a nanosheet that may be prepared using the same, and an electrical device including the materials. Proposed is a layered compound represented by [Formula 1] $Na_{1-x}In_yAs_z$ ($0 \leq x < 1.0$, $0.8 \leq y \leq 1.2$, $1.2 \leq z \leq 1.8$).

12 Claims, 12 Drawing Sheets

LAYERED COMPOUND AND NANOSHEET CONTAINING INDIUM AND ARSENIC, AND ELECTRICAL DEVICE USING THE SAME

BACKGROUND OF THE INVENTION

1. Field of the Invention

The present invention relates to a layered compound and a nanosheet containing indium and arsenic, and an electrical device using the same, and more particularly, to a layered compound and a nanosheet containing an alkali metal or alkaline earth metal and containing indium and arsenic having various electrical properties, and an electrical device using the same.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, indium arsenide is widely used in high-power, high-frequency electrical devices as a compound semiconductor material but ternary indium arsenide having a layered structure is not specifically known till now.

Ternary indium arsenide compounds having a layered structure, unlike existing indium arsenide compounds having a different crystal structure, are expected to allow diversified application, and to be applicable to new areas that have not been reached before.

SUMMARY OF THE INVENTION

According to an embodiment of the invention, there are provided a layered Group III-V compound having indium and arsenic, a nanosheet that may be prepared using the same, and an electrical device including the materials.

According to an embodiment of the invention, there is provided a layered compound represented by [Formula 1] $Na_{1-x}In_yAs_z$ (0≤x<1.0, 0.8≤y≤1.2, 1.2≤z≤1.8).

According to an embodiment of the invention, there is provided a nanosheet including a compound represented by [Formula 1] $Na_{1-x}In_yAs_z$ (0≤x<1.0, 0.8≤y≤1.2, 1.2≤z≤1.8), and prepared through a physical or chemical peeling method.

According to an embodiment of the invention, there is provided an electrical device including the layered compound or nanosheet as described above.

In addition, the electrical device may be a memristor.

A layered compound and a nanosheet provided through an embodiment of the invention may have various electrical properties, thereby enabling the development of new electrical devices.

DETAILED DESCRIPTION OF THE EXEMPLARY EMBODIMENTS

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

The layered compound or nanosheet according to an embodiment of the invention may be represented by Formula 1 below.

$$Na_{1-x}In_yAs_z \qquad \text{[Formula 1]}$$

(0≤x<1.0, 0.8≤y≤1.2, 1.2≤z≤1.8)

In general, InAs is a zinc blende crystal structure, which is incapable of having a layered structure, and accordingly, peeling InAs to form a nanosheet was hardly achievable.

In order to overcome the limitation, inventors of the invention have come up with an idea of adding additive elements to $In_yAs_z$ to place the additive elements between $In_yAs_z$ layers so as to prepare a layered compound in which the $In_yAs_z$ layers are connected. To this end, the inventors have calculated to create a layered material having a new composition and a crystal structure, and as a result, they have succeeded to synthesize a previously unreported new composition of a layered $Na_2In_2As_3$ so as to prepare a layered compound having a composition of Formula 1 above.

In the layered compound having the composition of Formula 1, Na is positioned between the $In_yAs_z$ layers to weakly bond the $In_yAs_z$ layers through van der Waals bonds, and a plane on which Na is positioned forms a cleavage plane that is easily cleaved along the plane.

Meanwhile, in the composition of Na in the $Na_{1-x}In_yAs_z$ layered compound or nanosheet, x may be 0 according to Formula 1 described above, and as described above, $Na_2In_2As_3$ is a previously unreported new synthesized material where x is 0 in Formula 1. Even without the removal of Na, the plane containing Na may be peeled off as a cleavage plane that forms weak van der Waals bonds.

In the layered compound according to an embodiment of the invention, as described above, Na is positioned between the $In_yAs_z$ layers to weakly bond the $In_yAs_z$ layers through the van der Waals bonds, and along this cleavage plane, the plane may thus be easily peeled off into the $In_yAs_z$ layers through either of both physical or chemical methods, and the more Na is removed, the easier the peeling is. Accordingly, through a physical or chemical peeling method, an $In_yAs_z$ nanosheet may be easily obtained from the layered compound, and in this case, Na may partially remain in the $In_yAs_z$ nanosheet.

With the continuous removal of the additive element Na, the distance between the $In_yAs_z$ compound layers gradually become greater to weaken the interlayer bond force, and eventually the bond between the layers breaks down, which may cause cracks between the layers. Therefore, the layered structure of the layered compound described in the invention includes a case where repeating two-dimensional $In_yAs_z$ layers are interlayer-bonded through van der Waals bonds by additive element Na as well as a case where the interlayer bonding force between $In_yAs_z$ layers is removed to increase the interlayer distance, thereby causing cracks. As such, Na is removed to weaken the interlayer bond, and accordingly, easier peeling to prepare a nanosheet may be achievable.

The nanosheet prepared through the peeling from the layered compound may be a single layer of $In_yAs_z$, but may be formed when a plurality of layers overlaps to be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 μm or greater, and thus, a thickness of the nanosheet is preferably 500 nm or less. In this case, Na may partially remain in the $In_yAs_z$ nanosheet.

As such, the nanosheet according to an embodiment of the invention refers to a sheet peeled off from a layered compound through a physical or chemical method, and includes being formed as a plurality of $In_yAs_z$ layers in addition to being formed as a single $In_yAs_z$ layer.

Figure 1:
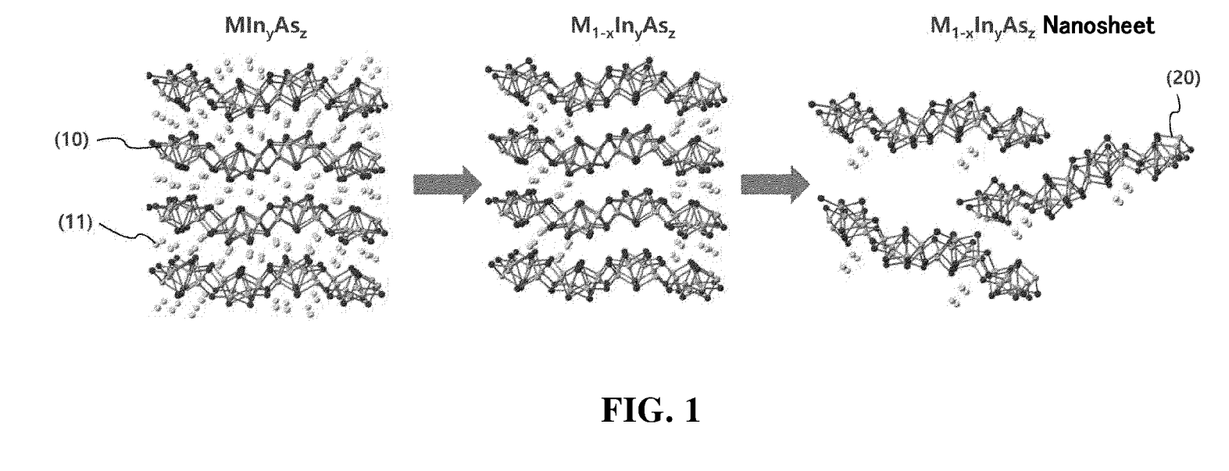
FIG. 1 is a conceptual diagram of a layered compound and a nanosheet prepared according to an embodiment of the invention.

A conceptual view of examples of the layered compound and the nanosheet is shown in FIG. 1, which shows that an additive element, Na 11, is positioned between $In_yAs_z$ layers 10 of $NaIn_yAs_z$ to keep the bond between the $In_yAs_z$ layers 10, and in this case, the removal of Na 11 allows the layers to switch to $Na_{1-x}In_yAs_z$, and to weaken the bond between the $In_yAs_z$ layers 10, and thus to be easily peeled off physically or chemically, thereby, in the end, developing into a $In_yAs_z$ nanosheet 20. Nanosheets prepared using this way may still contain some Na 11.

Therefore, x may satisfy 0.1≤x≤0.9 to ensure easy peeling and to prevent the breakdown of the layered structure or changes in the crystal structure due to excessive removal of Na. In this case, the crystal structure of the layered compound may have a space group of $P2_1/c$. The nanosheet peeled off from the layered compound having the range of x described above may equally satisfy 0.1≤x≤0.9.

In addition, residual Na in the $Na_{1-x}In_yAs_z$ layered compound or nanosheet may be in the range of 0.3≤x≤0.8 according to Formula 1 below.

In the layered compound, in which an additional element, Na is partially removed and a certain amount of Na remains, Na which is an additional element remaining between the layers, becomes movable to exhibit various electrical properties. Therefore, it may be preferable that the additive element is removed in a certain fraction or greater from the $Na_{1-x}In_yAs_z$ compound and the rest some remain. x for this may have a range of 0.3≤x≤0.8.

In Formula 1, y may satisfy 0.8≤y≤1.2, and z may satisfy 1.2≤z≤1.8, and y and z may have slight changes due to defects in initially prepared $Na_2In_2As_3$, and the removal of Na may cause slight changes in the ratio of In to As during the removal process, and thus, values of y and z in $Na_{1-x}In_yAs_z$ may change within a range that does not alter the crystal structure for a given amount of Na.

Meanwhile, a strong acid such as nitric acid or hydrochloric acid may be used for the removal of additive elements, and as the additive elements are removed through the strong acid, the place where the additive elements are removed is replaced with hydrogen ions contained in the strong acid which is then bonded thereto, and thus a layered compound containing hydrogen and a nanosheet prepared using the compound may be provided.

The layered compound containing hydrogen ions or the nanosheet therefrom may be represented by Formula 2 below.

$$Na_{1-x}H_nIn_yAs_z \qquad \text{[Formula 2]}$$

(0≤x<1.0, 0.8≤y≤1.2, 1.2≤z≤1.8, 0<n≤x)

In this case, hydrogen ions replace Na, an additive element, and are added in less than the amount of Na removed.

The range of x, an amount from which Na is removed, may be 0.1≤x≤0.9, and more preferably may be 0.3≤x≤0.8. As described above, when some of the additive elements are removed and the rest some remain, the layered structure of the initial layered compound, $NaIn_yAs_z$, is kept as it is, and as the additive element, Na, is partially removed, the interlayer bonding force is weakened to easily peel the compound off into the $In_yAs_z$ layers, thereby exhibiting various electrical properties through the residual additive elements.

In addition, n above may have the same value as x, and hydrogen ions may replace the removed additive elements to be contained in the layered structure compound.

The layered compound and the nanosheet described above exhibit various properties as a result of analysis, and these properties will be described below.

The layered compound and the nanosheet described above may have a space group of $P2_1/c$ in XRD measurement using CuKα rays.

Meanwhile, in XRD measurement using CuKα rays, the layered compound or nanosheet described above may have peaks at the positions of 2θ=11.9°±0.50°, 12.8°±0.50°, 13.5°±0.50°, 15.3°±0.50°, 21.6°±0.50°, 22.7°±0.50°, 23.8°±0.50°, and 27.8°±0.50°, and the peaks may have an intensity of 1% or greater (preferably 3% or greater, more preferably 5% or greater) with respect to a peak having the greatest intensity.

Meanwhile, as the additive elements are removed from the layered compound or nanosheet, slight changes in the XRD measurement peak may be observed, and according to the changes, in the XRD measurement using CuKα rays, the layered compound has a $I_{(102)}/I_{(002)}$ value of 0.40 or less which is a peak intensity of a (102) plane to a peak intensity of a (002) plane. This is caused when the interlayer distance gradually increases due to the removal of the additive elements from the layered compound, and the same is true for the nanosheet.

The layered compound in which the additional element, Na partially remains, and the nanosheet using the compound may exhibit various electrical properties due to the residual Na.

The layered compound or nanosheet as described above may exhibit various electrical properties due to a unique layered structure and residual additive elements.

First, the layered structure compound or the nanosheet according to an embodiment of the invention exhibits ferroelectric-like properties.

Ferroelectric properties are generally found in oxides of an asymmetric structure such as $BaTiO_3$ of a perovskite structure, and are found according to changes in the position of Ba located at the center.

However, the layered structure compound or the nanosheet according to an embodiment of the invention does not have the asymmetric structure, but nevertheless exhibits ferroelectric properties. Despite the fact that the layered structure compound or the nanosheet does not have an asymmetrical structure, the layered structure compound or the nanosheet still exhibit ferroelectric-like properties since the position of the residual additive elements moves according to an external electric field.

The ferroelectric-like properties of the layered compound or nanosheet according to an embodiment of the invention enables application to various electrical devices.

In addition, the layered structure compound or the nanosheet according to an embodiment of the invention may exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using these properties, memory devices such as a memristor capable of storing information like a flash memory have been actively developed, and, through the resistance switching properties, the layered compound and the nanosheet of an embodiment of the invention may be actively used in the development of memory devices such as the memristor.

Example

1) Synthesis of $Na_2In_2As_3$ Having a Layered Structure

Na, In, and As were weighed at a molar ratio of 2:2:3, mixed, and then put into an alumina crucible. Next, the mixture was placed in a quartz tube which was then double-sealed to block outside air. The process was performed in a glove box under argon atmosphere. Thereafter, the resultant was put at a temperature raised to 1000° C. in a box furnace, kept for 12 hours, cooled to 500° C. at a temperature reduction rate of 5° C./h, then kept for 100 hours at 500° C., and cooled to room temperature to obtain $Na_2In_2As_3$.

2) Removal of Na

The layered $Na_2In_2As$ was subjected to reaction over time in a 0.25M HCl solution diluted with ethanol to remove Na therefrom. The results are shown in the table below. In Table 1, the residual Na represents the results obtained through EDS analysis.

TABLE 1

| Name of sample | Removal of additive elements | Reaction time | Residual Na (at %) |
| --- | --- | --- | --- |
| Sample A | — | — | 28 |
| Sample B | Hydrochloric acid | 0.5 hours | 17.4 |
| Sample C | Hydrochloric acid | 1 hour | 10.7 |
| Sample D | Hydrochloric acid | 1.5 hours | 8.8 |
| Sample E | Hydrochloric acid | 4 hours | 1.5 |

3) Process of Preparing Nanosheets

The samples prepared as in Table 1 above were irradiated with ultrasonic waves in ethanol to prepare peeled nanosheets using a tape.

The inventors have calculated to project a layered structure using vienna ab initio simulation package (VASP) for a previously unreported new $Na_2In_2As_3$ compound, and as a result, they have found out that the layered structure had a structure of $P2_1/c$ similar to known $Na_2Al_2As_3$ and $Na_2Ga_2As_3$.

Figure 2:
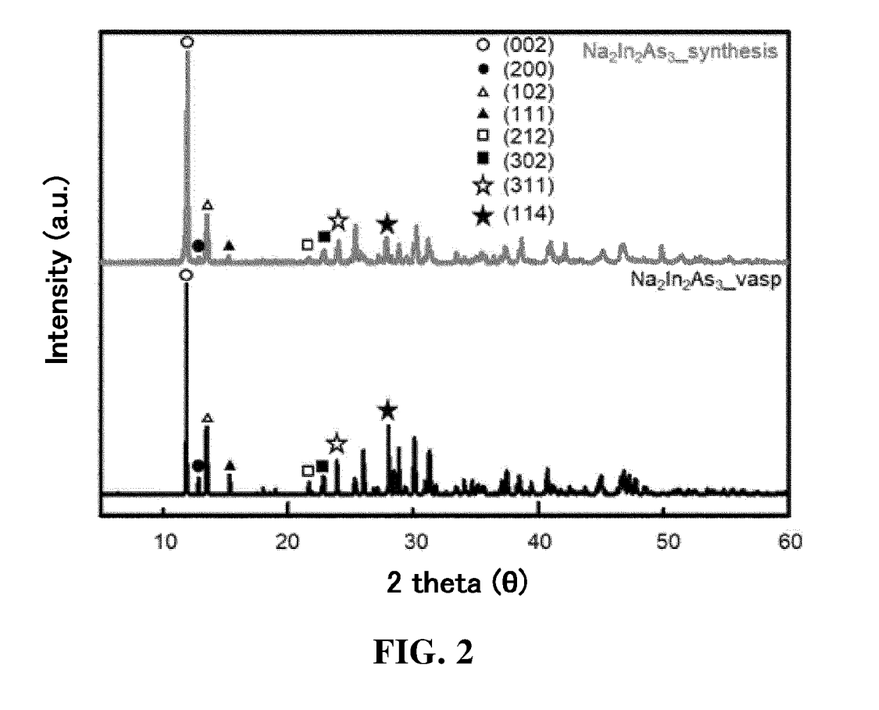
FIG. 2 is a graph showing XRD diffraction patterns of a layered compound according to an embodiment of the invention.

FIG. 2 shows XRD diffraction patterns ($Na_2In_2As_3$_vasp) of $Na_2In_2As_3$ projected through the calculation using VASP and XRD rotation patterns of Sample A($Na_2In_2As_3$_synthesis) synthesized through the method described above. When comparing the peaks of the calculated data with the peaks of the data for Sample A, which is an actual synthesized compound, it was found that (002), (200), (102), (111), (212), (302), (311), and (114) were detected. The 2θ angles of the planes were 11.9°, 12.8°, 13.5°, 15.3°, 21.6°, 22.7°, 23.8°, and 27.8°, respectively.

Figure 3:
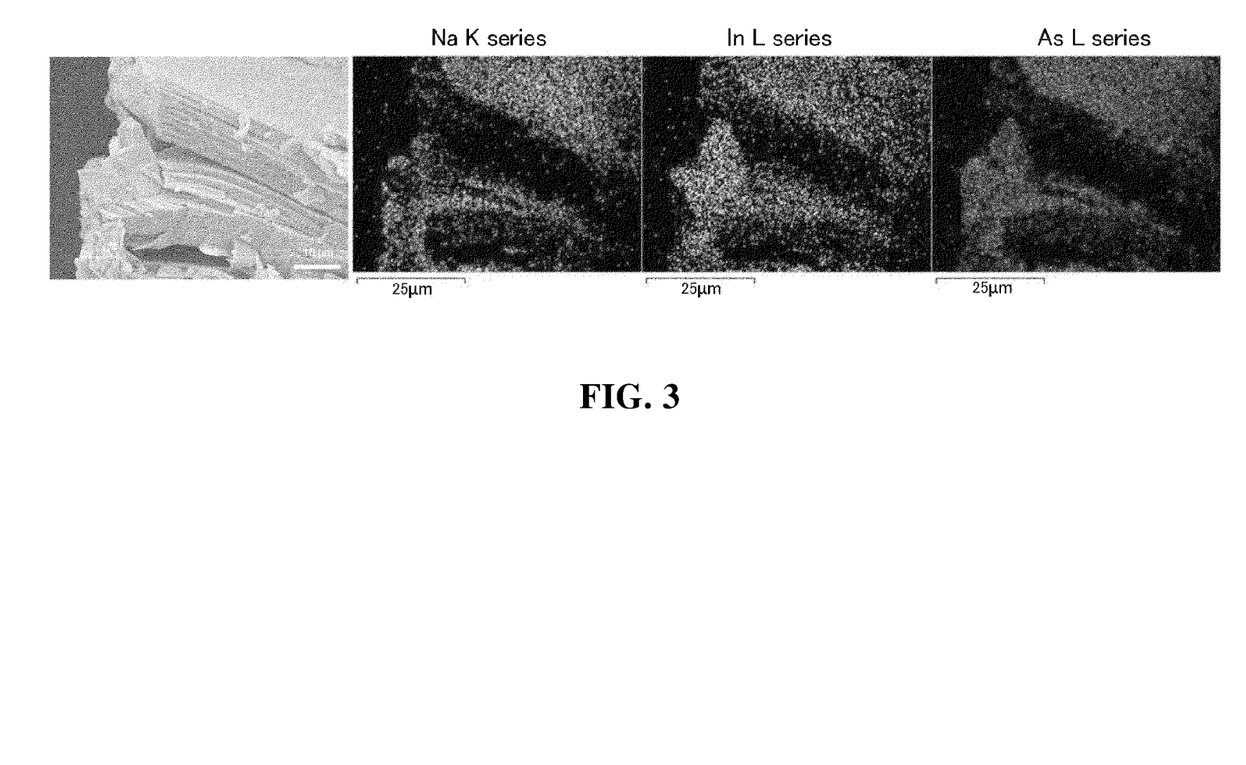
FIG. 3 shows a scanning electron microscopy (SEM) image of a layered compound according to an embodiment of the invention and results of energy dispersive spectroscopy (EDS) analysis.

FIG. 3 shows a scanning electron microscopy (SEM) image of the synthesized Sample A and results of energy dispersive spectroscopy (EDS) analysis. From the EDS results, it was found that the synthesized Sample A was composed of Na, In, and As.

Figure 4:
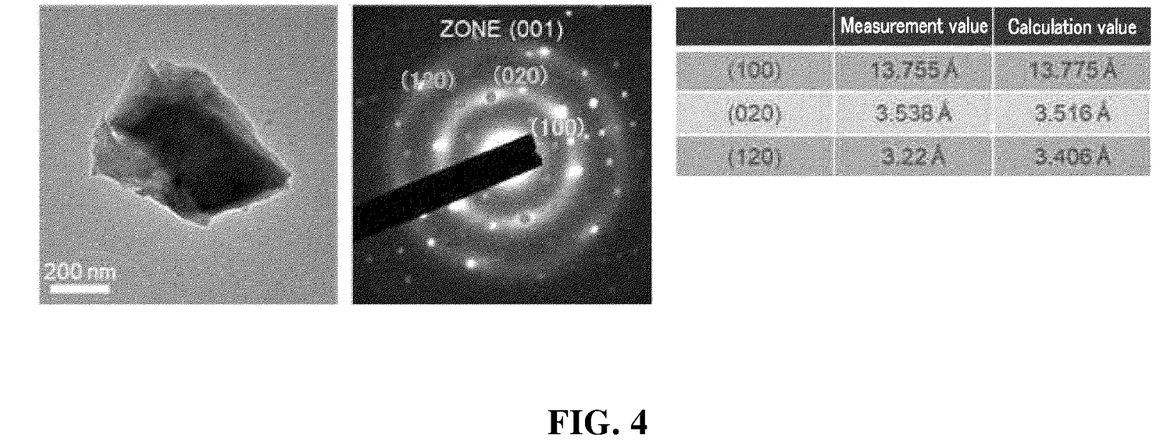
FIG. 4 shows results of transmission electron microscopy (TEM) analysis of a layered compound according to an embodiment of the invention.

FIG. 4 shows results of transmission electron microscopy (TEM) analysis of Sample A. As a result of selected area electron diffraction (SAED) analysis through TEM for Sample A, patterns in which the space group of $P2_1/c$ was present in the (001) direction were measured, and the distance between each (100), (020), and (120) plane was found to be similar in calculation and measurements.

Figure 5:
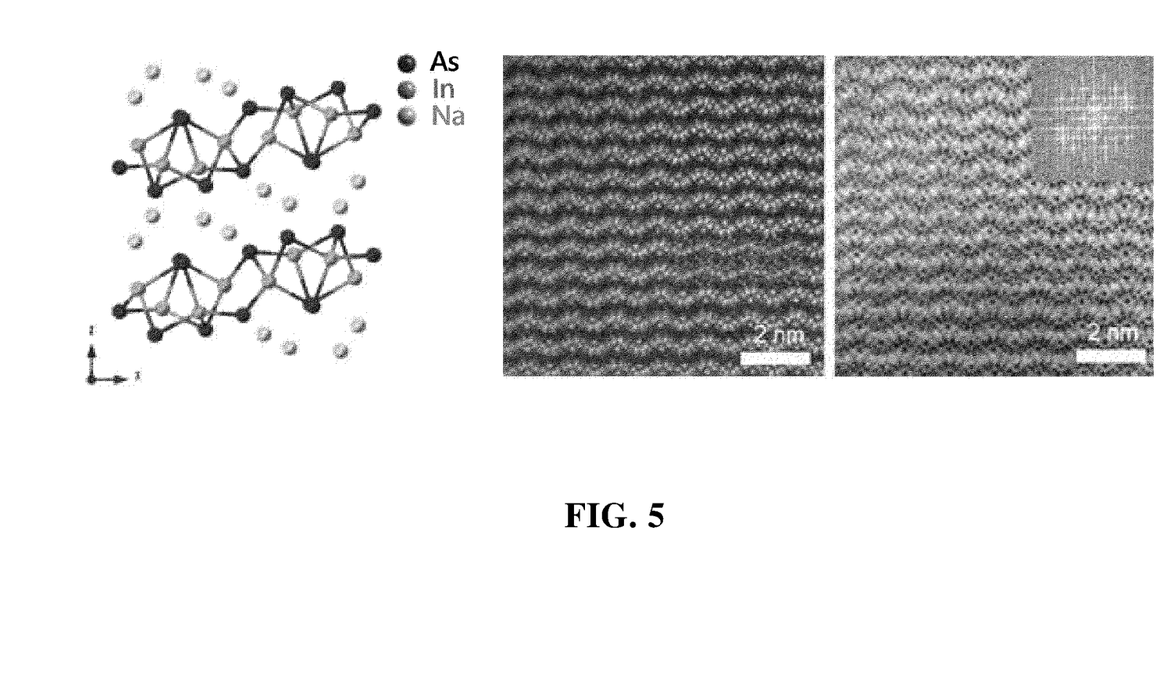
FIG. 5 shows a schematic view of the structure of $Na_2In_2As_3$ according to an embodiment of the invention and results of scanning transmission electron microscopy (STEM) analysis.

FIG. 5 shows a schematic view of the structure of $Na_2In_2As_3$ and results of scanning transmission electron microscopy (STEM) analysis. The results of STEM analysis found that the synthesized Sample A had a $P2_1/c$ space group.

As such, the results of FIGS. 2 to 5 found that the synthesized Sample A was $Na_2In_2As_3$, a layered material having a new composition and a crystal structure having a $P2_1/c$ space group.

Figure 6:
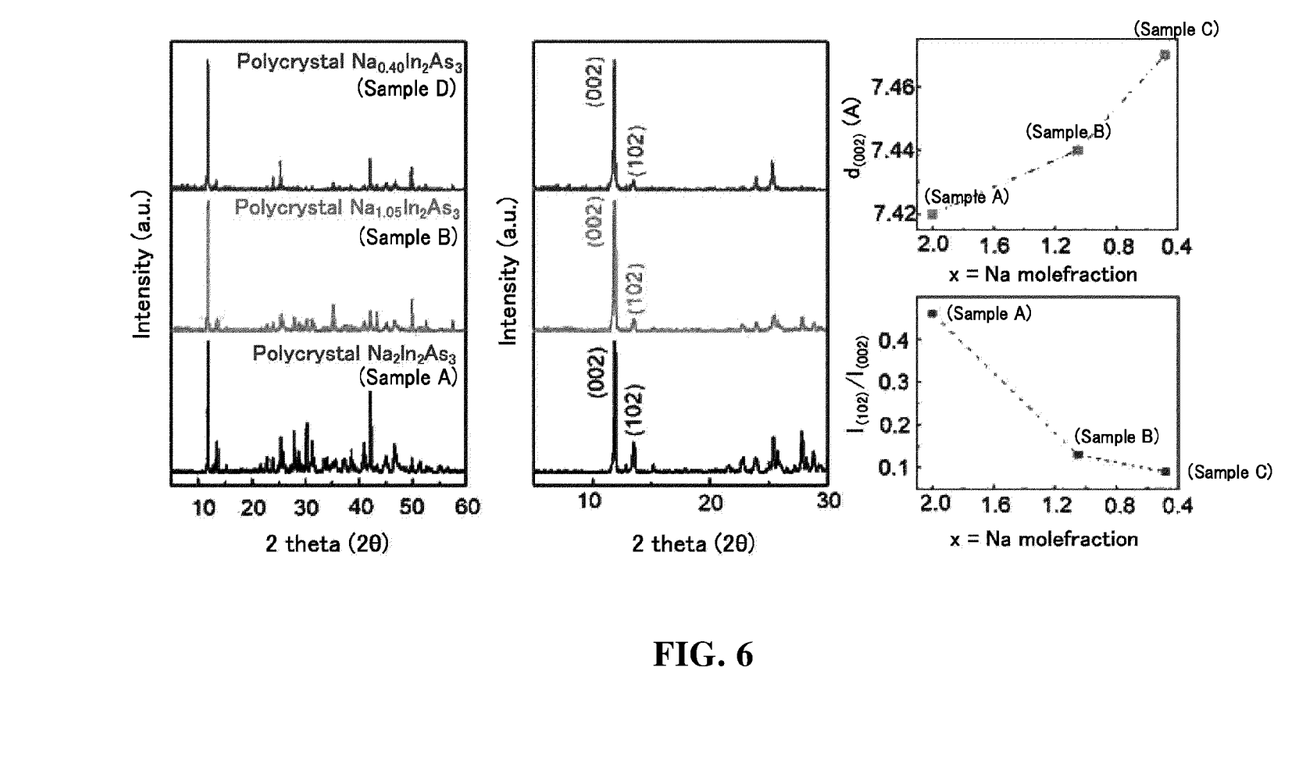
FIG. 6 is shows results of XRD analysis of a layered compound according to an embodiment of the invention.

FIG. 6 shows changes in XRD peaks according to the removal of Na. In Sample A in which Na was not removed, the interplanar distance of the (002) plane was 7.42 Å, and as Na was removed, the interplanar distance gradually increased up to 7.47 Å. Changes in the XRD peaks as well were observed according to the changes in the interplanar distance, and it was found that with the removal of Na, the size of the peaks of the (102) plane to the peaks of the (002) plane gradually decreased. Accordingly, the value of $I_{(102)}/I_{(002)}$ was 0.46 in Sample A, decreased to 0.13 in Sample B and to 0.09 in Sample D. In addition, when the XRD peaks were compared after the removal of Na, the (002) and (102) planes showed the same peaks, indicating that the crystal structure having a $P2_1/c$ space group was kept.

Figure 7:
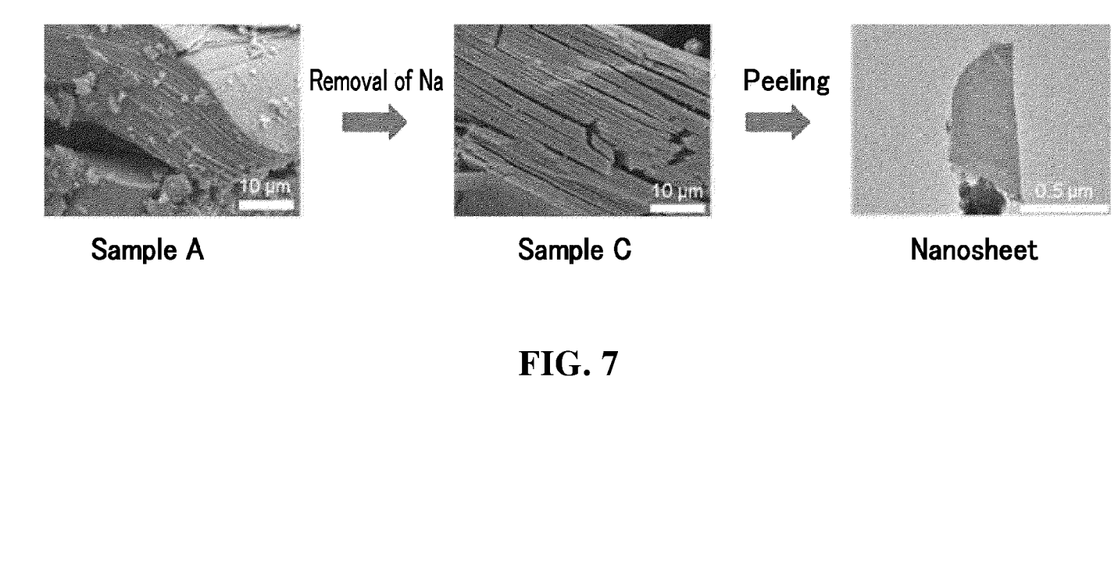
FIG. 7 is SEM and TEM images of a layered compound and a nanosheet according to an embodiment of the invention.

FIG. 7 shows a nanosheet prepared by removing Na from Sample A to become Sample C, and being peeled off from Sample C using a tape. In Sample A, a cleavage plane between the layers was observed, but in Sample C, as Na was removed, the interlayer distance increased, thereby forming cracks.

Figure 8:
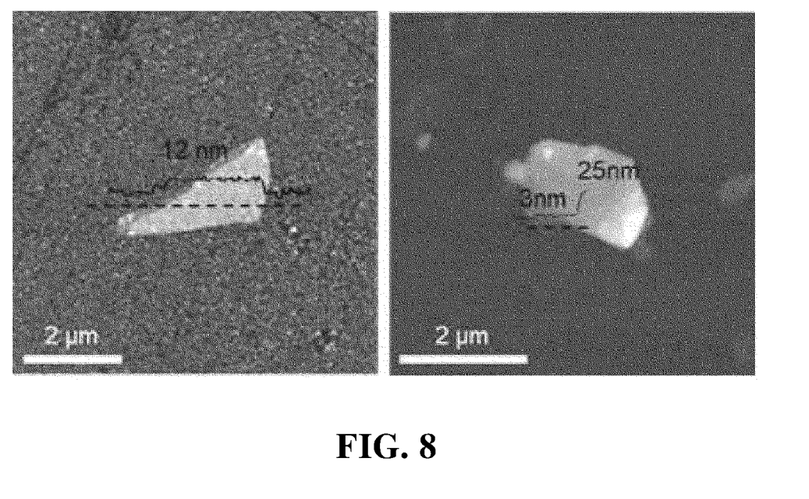
FIG. 8 shows an atomic force microscopy (AFM) image of a nanosheet according to an embodiment of the invention and a line-profile therefrom.

FIG. 8 shows an atomic force microscopy (AFM) image of a nanosheet prepared by being peeled off from Sample C and a line-profile therefrom. It was confirmed that a nanosheet was peeled off to have a thickness of 10 nm to 30 nm.

Figure 9:
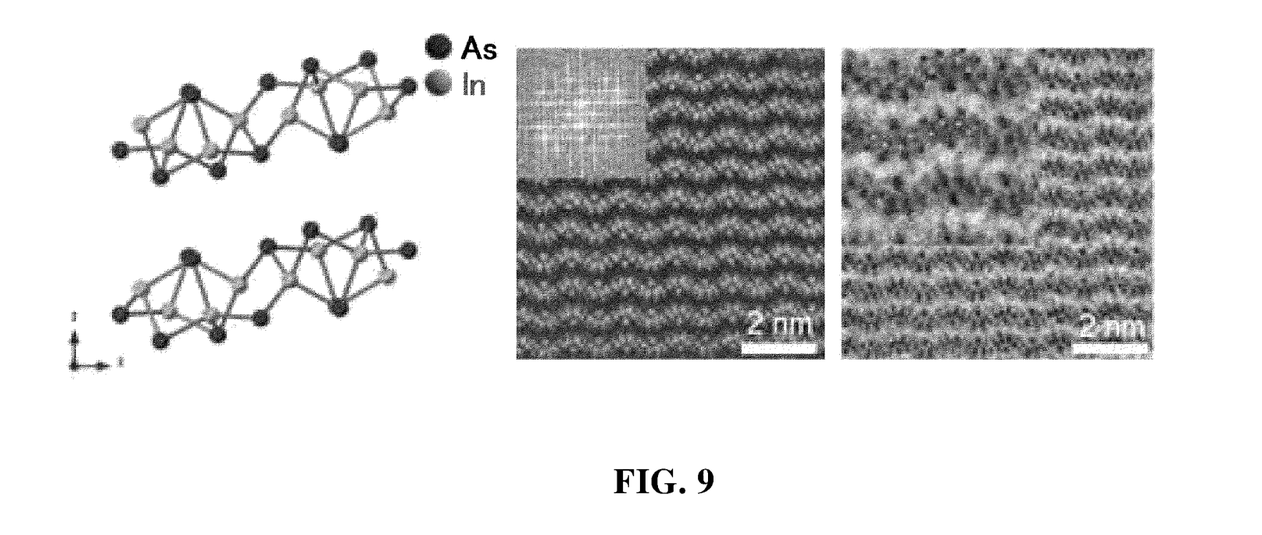
FIG. 9 shows results of STEM analysis of a layered compound according to an embodiment of the invention.

FIG. 9 shows results of scanning transmission electron microscopy (STEM) analysis of Sample D. The data showed that Na was partially removed and there were no changes in the crystal structure even after the removal.

Figure 10:
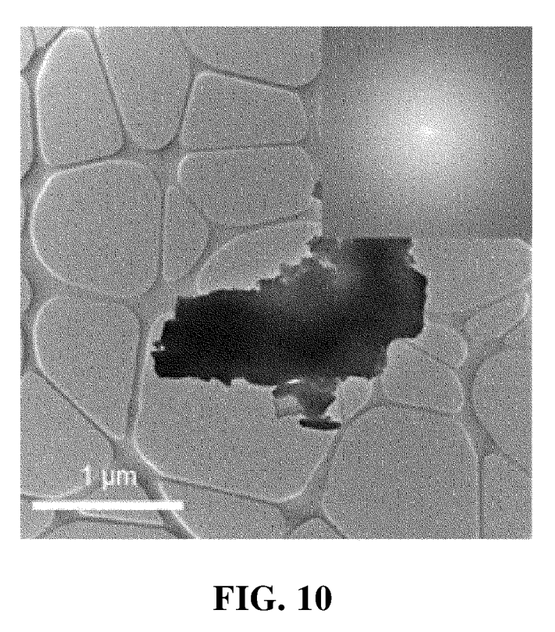
FIG. 10 shows results of TEM analysis of a layered compound according to an embodiment of the invention.

FIG. 10 is results of TEM analysis of Sample E. It was found that an amorphous structure appeared with the excessive removal of Na.

Figure 11:
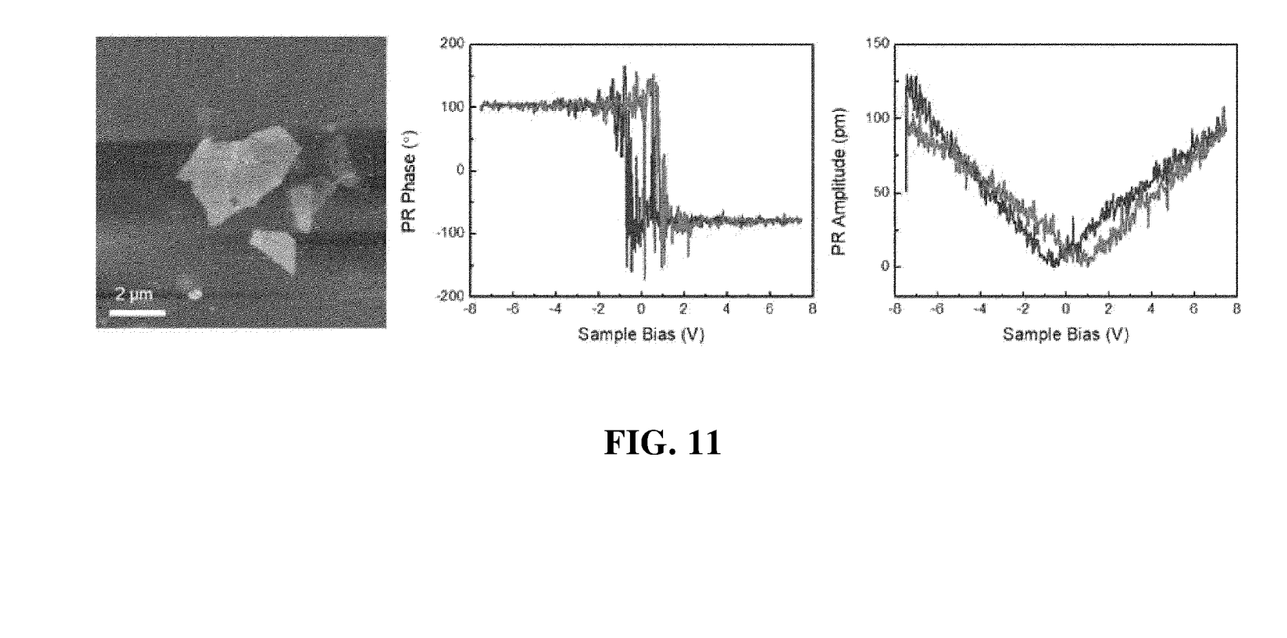
FIG. 11 shows results of evaluation on ferroelectric properties of a nanosheet according to an embodiment of the invention through piezoresponse force microscopy (PFM)

Ferroelectric properties were measured through piezoresponse force microscopy (PFM) for the nanosheet peeled off from Sample C, and the results are shown in FIG. 11. It was found that the nanosheet had similar ferroelectric-like properties.

Figure 12:
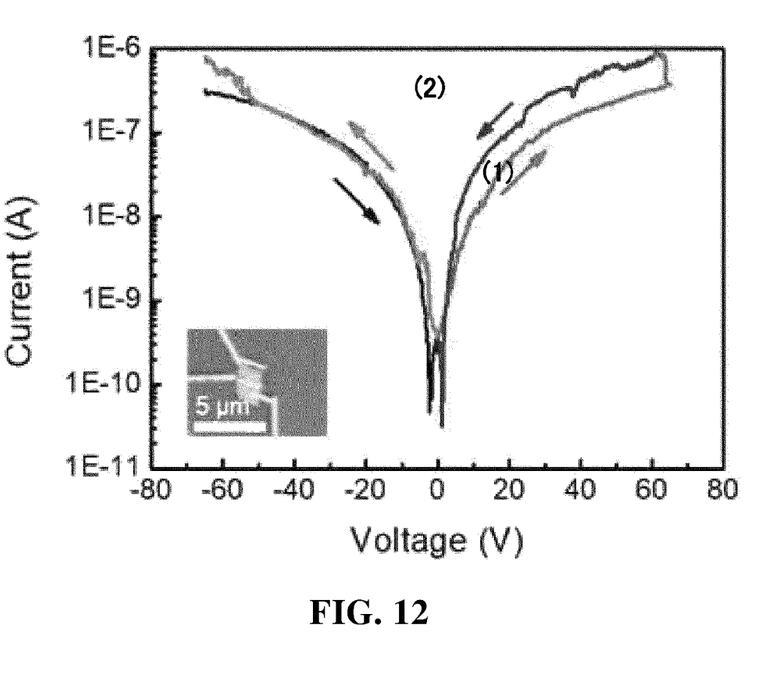
FIG. 12 is a graph of changes in current according to voltage for a nanosheet according to an embodiment of the invention.

In addition, current changes according to voltages were measured for the nanosheet peeled off from Sample C, and results are shown in FIG. 12.

It was found that at an initial voltage, the nanosheet kept a high resistance state 1, indicating a low current flow, but when the voltage was greater than a certain level, the nanosheet switched to a low resistance state 2, indicating a sharp increase in the current, and the same properties were shown in an opposite electrode direction, thereby showing resistance switching properties.

It was found that using the resistance switching properties, the nanosheet would be applied as a memristor device, which is being actively developed as a neuromorphic memory device.

What is claimed is:

1. A layered compound represented by Formula 1 below:

$$Na_{1-x}In_yAs_z$$

(0.3≤x≤0.8, 0.8≤y≤1.2, 1.2≤z≤1.8) wherein the layered compound exhibits ferroelectric-like properties.

2. The layered compound according to claim 1, wherein the layered compound further comprises H.

3. The layered compound according to claim 1, wherein, in XRD measurement using CuKα rays, the layered compound has peaks at positions of 2θ=11.9°±0.50°, 12.8°±0.50°, 13.5°±0.50°, 15.3°±0.50°, 21.6°±0.50°, 22.7°±0.50°, 23.8°±0.50°, and 27.8°±0.50°, the peaks having an intensity of 1% or greater with respect to a peak having the greatest intensity.

4. The layered compound according to claim 1, wherein a crystal structure of the layered compound represents a space group of $P2_1/c$.

5. The layered compound according to claim 1, wherein, in XRD measurement using CuKα rays, the layered compound has a $I_{(102)}/I_{(002)}$ value of 0.40 or less which is a peak intensity of a (102) plane to a peak intensity of a (002) plane.

6. The layered compound according to claim 1, wherein the layered compound exhibits resistance switching properties.

7. A nanosheet comprising a compound represented by Formula 1 below, and prepared through a physical or chemical peeling method:

$$Na_{1-x}In_yAs_z$$

(0.3≤x≤0.8, 0.8≤y≤1.2, 1.2≤z≤1.8)
wherein the compound exhibits ferroelectric-like properties.

8. The nanosheet according to claim 7, wherein a crystal structure of the compound exhibits a space group of $P2_1/c$.

9. The nanosheet according to claim 7, wherein, in XRD measurement using CuKα rays, the compound has a $I_{(102)}/I_{(002)}$ value of 0.40 or less which is a peak intensity of a (102) plane to a peak intensity of a (002) plane.

10. The nanosheet according to claim 7, wherein the compound exhibits resistance switching properties.

11. The nanosheet according to claim 7, wherein the nanosheet has a thickness of 500 nm or less.

12. An electrical device comprising the layered compound according to claim 1.

* * * * *